US011444602B2

(12) United States Patent
Scarpa et al.

(10) Patent No.: US 11,444,602 B2
(45) Date of Patent: *Sep. 13, 2022

(54) UNIVERSAL AUTOMATIC FREQUENCY CONTROL FOR MULTI-CHANNEL RECEIVERS

(71) Applicant: Sirius XM Radio Inc., New York, NY (US)

(72) Inventors: Carl Scarpa, Plainsboro, NJ (US); Robert Joseph Topper, Montgomery, PA (US)

(73) Assignee: Sirius XM Radio Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,885

(22) Filed: Jun. 22, 2020

(65) Prior Publication Data

US 2021/0143799 A1    May 13, 2021

Related U.S. Application Data

(63) Continuation of application No. 16/655,890, filed on Oct. 17, 2019, now Pat. No. 10,693,442.

(51) Int. Cl.
  *H04W 24/02* (2009.01)
  *H03J 7/04* (2006.01)
  *H03J 1/00* (2006.01)

(52) U.S. Cl.
  CPC ............ *H03J 7/047* (2013.01); *H03J 1/0008* (2013.01)

(58) Field of Classification Search
  CPC ........... H04W 24/02; H03K 5/02; H04B 1/69; H04B 1/7183; H04B 1/06; H03J 1/008; H03J 7/047; H04L 27/16; H04L 27/32
  See application file for complete search history.

(56) References Cited

U.S. PATENT DOCUMENTS

| | | | |
|---|---|---|---|
| 2003/0163822 A1* | 8/2003 | Knutson | H04H 40/90 725/68 |
| 2017/0153279 A1* | 6/2017 | Chung | H03D 7/12 |
| 2020/0309933 A1* | 10/2020 | Ray | G01S 13/86 |
| 2021/0033396 A1* | 2/2021 | Scafidi | G01C 19/5776 |
| 2021/0136802 A1* | 5/2021 | Cirik | H04W 72/1278 |
| 2021/0391953 A1* | 12/2021 | Abdelghaffar | H04W 72/1289 |

OTHER PUBLICATIONS

International Search Report PCT Application No. PCT/US2020/056294, dated Dec. 18, 2020.

* cited by examiner

*Primary Examiner* — Thanh G Le
(74) *Attorney, Agent, or Firm* — Kramer Levin Naftalis & Frankel LLP

(57) ABSTRACT

Systems and methods for performing automatic frequency control are provided. Instead of relying on individual frequency tuners for each channel of a multi-channel receiver system, the present subject matter uses a single frequency tuner for receiving each channel of the multi-channel receiver system. A locked demodulator may be designated as a reference demodulator and frequency offset values associated with the reference demodulator may be applied to other demodulators of the multi-channel receiver. These frequency offset values may be used by individual demodulators of each channel for correcting corresponding frequency offsets.

13 Claims, 7 Drawing Sheets

UNIVERSAL AUTOMATIC FREQUENCY CONTROL FOR MULTI-CHANNEL RECEIVERS

TECHNICAL FIELD

The present subject matter relates to automatic frequency control (AFC) for multi-channel receivers such as, for example, satellite and broadband receivers.

BACKGROUND

In some communication systems, rather than using a single signal, a plurality of signals may be used to transmit data. For example, Sirius XM Radio Inc., which merged from two originally separate and independent satellite broadcast companies, specifically, Sirius Satellite Radio Inc. and XM Satellite Radio Inc., utilizes a network of satellites and terrestrial repeaters to transmit data over a plurality of signals. Such a network may include six satellite signals and three terrestrial repeater signals, with signals originating from the Sirius side occupying a lower frequency range (e.g. 2320 MHz-2332.5 MHz), and signals originating from the XM side occupying a higher frequency range (e.g. 2332 MHz-2345 MHz).

In such a multi-signal system, frequency offsets often occur that need to be corrected either at the source of transmission and/or at the receiver. For example, the transmitter itself may not be transmitting at the precise frequency. In the case of a satellite signal, a system failure, signal drifts, and/or calibration errors at the satellite are some examples that may cause the satellite signal to be transmitted with a frequency offset at the source. In the event of a failure of a satellite frequency translator, the frequency may vary throughout the day, even moving constantly. Similar problems may also be present at a terrestrial repeater.

In the case of a mobile receiver, the frequency offset due to environmental influences (e.g., temperature fluctuations) is constantly changing as it travels and therefore needs to be corrected so that the transmitted signal may be processed and used by the mobile receiver.

The design of a receiver may be relatively straightforward if there is a separate frequency tuner for each signal. However, such an approach may increase receiver costs, footprint, and may result in an overall inefficient receiver design.

Additional factors at the receiver may also contribute to frequency offsets that require correction. For example, it may be desirable to use inexpensive oscillators in the frequency tuner to reduce cost, but such oscillators may be less accurate due to variations in their crystal oscillator frequencies. Plus, the oscillator frequency may vary significantly based on temperature. This is a particular challenge in the case of a car receiver, which may experience significant temperature swings (and corresponding frequency offsets), for example, from cold startup to a desirable operating temperature.

To correct frequency offsets of the different signals, traditional automatic frequency control (AFC) correction methods for multi-channel satellite radio systems generally measure the frequency offset from a single demodulator corresponding to a particular signal and then apply a correction by adjusting a center frequency of the tuner of the receiver. Although this may correct the frequency offset for that particular signal, if other signals have offsets that differ from that of the signal used to make the tuner correction, these other signals may require additional frequency corrections, which the traditional AFC would fail to correct. Additionally, this requires the tuner to be capable of having its center frequency externally controlled, which may add complexity, cost and may necessitate calibration of a switched capacitor network used for center frequency adjustments.

For example, in a multi-channel system, such as Sirius XM Radio Inc.'s system, if the receiver implementing traditional AFC method is using a satellite signal as the reference signal, the receiver would be constantly monitoring that satellite reference signal and measuring and correcting for the frequency offset with respect to that reference signal. If that reference signal is lost, however (for example when the receiver is travelling in a metropolitan area and that signal is blocked by a tall building), the receiver will need to switch to another signal, e.g., a terrestrial signal to try to pick up the broadcast. But because the frequency offset from the satellite signal may be different from the terrestrial signal, a reference frequency offset from the satellite signal may not correct the frequency offset from the terrestrial signal when the receiver makes the switch, or vice versa, resulting in loss of decoded signal.

The traditional correction method is particularly problematic in the case of a satellite signal and a terrestrial signal that differ in frequency by more than one frequency bin when using frequency division multiplexing (e.g., Coded Orthogonal Frequency-Division Multiplexing (COFDM). For example, if the satellite and terrestrial signals are alternately present, an amount of AFC correction may be determined based on a measured offset for whichever signal is currently present. The center frequency of the tuner may then be adjusted accordingly based on the amount of the AFC correction. If the frequency offset between the two signals is greater than a width of a COFDM frequency bin, the receiver may need to determine which COFDM frequency bin contains the corresponding data and switch to that frequency bin. Otherwise, data may be assigned to incorrect bins leading to forward error correction (FEC) block errors. This may result in brief muting of the decoded signal until the frequency offset is accurately determined and compensated for. In the case of satellite radio, this means that the listener would hear a silent gap in the audio program. Therefore, there exists a need to alleviate these problems by avoiding the need to make adjustments to the center frequency of the tuner. The design of a receiver provided with a tuner that may handle more than one signal may result in, for example, a lower cost, a smaller footprint, and/or increased efficiency of the receiver and a seamless user listening experience.

SUMMARY

Systems and methods for AFC correction that are independent of the tuner are described herein. The AFC correction can account for arbitrary center frequency offsets associated with any of the signals received by maintaining a respective frequency offset value for each of the signals. The respective frequency offset value may then be applied to individual demodulators of each signal instead of applying a single frequency correction value to the tuner.

In some embodiments, a receiver including a plurality of demodulators that respectively correspond to a plurality of signals received may determine frequency offset values that respectively correspond to each of the signals. In the event that one of the demodulators is unable to lock onto one of the signals, the receiver may apply the frequency offset value of another one of the signals, to that demodulator. In some instances, the receiver may update a phase and interpolation ratio for that demodulator based on the applied frequency offset.

BRIEF DESCRIPTION OF THE DRAWINGS

For a more complete understanding of the inventive embodiments, reference is made to the following description taken in connection with the accompanying drawings in which.

DETAILED DESCRIPTION

Figure 1:
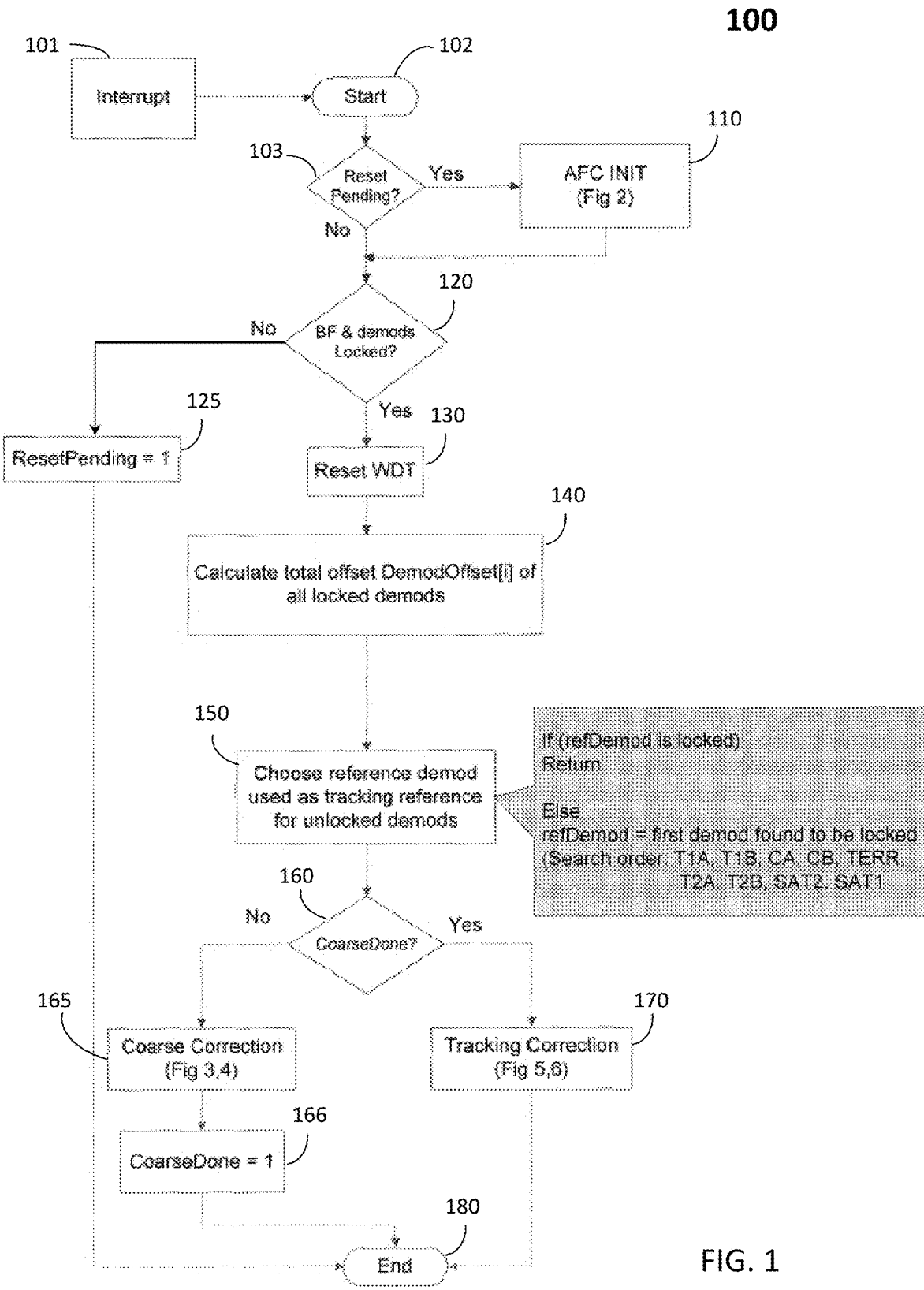
FIG. 1 is an example of a process flow for an AFC correction method in accordance with an exemplary embodiment of the present subject matter.

A detailed description of one or more embodiments or implementations of the invention is provided below along with accompanying figures that illustrate the principles of the invention. The referenced figures are only for the purpose of illustrating embodiments, but the invention is not limited to any particular embodiment. Numerous specific details are set forth in the following description in order to provide a thorough understanding of the invention. These details are provided by way of example and the invention may be practiced according to the claims without some or all of these specific details. For the purpose of clarity, technical material that is known in the technical fields related to the invention has not been described in detail so that the invention is not unnecessarily obscured. Various inventive features are described below that may be apparent from the description and drawings and each of the inventive features may be used independently of one another or in combination with other features.

The present subject matter may allow for the use of many different frequency tuner types and eliminate the need for the external center frequency adjustment of a tuner. It may uniquely compensate for inter-channel frequency offsets by tracking a respective frequency drift for each signal, and using a frequency drift of a reference signal for correcting frequency offsets for signals that are intermittently lost during transmission. The present subject matter, for example, solves the problem of audio muting caused by incorrect frequency offset estimations and processing of incorrect COFDM frequency bins that may result in signals of individual channels appearing and disappearing while a tuner center frequency is being adjusted to account for the frequency offsets.

To reduce or eliminate at least some of the problems of traditional AFC corrections methods, the present subject matter provides a new AFC method and system that maintains a respective frequency offset value for each signal in the system. These frequency offset values may be used by individual demodulators for decoding the respective signals instead of using a single frequency offset correction value at the frequency tuner.

Rather than constantly tracking frequency offsets with respect to a reference signal, and using the frequency offset values to adjust the frequency of the tuner (e.g., by making fine frequency corrections), the present subject matter, for example, eliminates inefficient and expensive hardware implementation required to make such fine frequency corrections. Instead, in various embodiments of the present subject matter, frequency offsets for each of the signals may be separately measured, stored, and applied to individual demodulators instead of applying frequency correction values to the tuner.

In some embodiments, no adjustments to the tuner frequencies may be needed at any point in this automatic frequency control (AFC) process, making this process universal for any tuner type. In some embodiments, fine frequency adjustments may be performed digitally in baseband processing within the receiver by one or more processors.

For signals that are currently being received, each signal's frequency offset may be used to correct a respective center frequency of that particular signal.

When signals disappear (for example, when a signal is blocked by an obstacle), their frequency offset correction values may be adjusted based on an accumulated drift value for one of the signals currently being received, and not necessarily by an absolute frequency offset for that signal. It is assumed that any frequency drift is caused by a tuner and not by individual signal sources. For example, if one of the present satellite signals is determined to have drifted by an estimated drift value, (e.g., by +500 Hz) from its previously frequency corrected value, a stored frequency offset of the signals not currently being received may be adjusted by an amount approximately equal to the drift value (e.g., by +500 Hz). This way, when those signals reappear, their center frequencies would likely be very close to a correct value. This may be because the frequency drift was caused by the receiver's reference oscillator which may affect all channels equally. Receivers may calculate the difference of a demodulator's second order term (once locked to a signal) with its nominal default value (which assumes no offset). The difference may approximate the frequency offset.

In general, the order of the steps of disclosed processes may be altered within the scope of the invention. Unless stated otherwise, a component, such as a processor or a memory described as being configured to perform a task, may be implemented as a general component that is temporarily configured to perform the task at a given time or a specific component that is manufactured to perform the task. As used throughout the specification, the terms "channel" and "signal" are used interchangeably.

FIG. 1 shows a flowchart of an example of a universal AFC correction method 100 in accordance with some aspects of the present subject matter.

The system implementing the universal AFC correction method may include a single frequency tuner that may receive a plurality of different signals including satellite and terrestrial signals.

At 101, an interrupt signal may trigger a start of the process flow 102 for the flowchart 100. The interrupt signal may be generated if a signal being received by the tuner of a receiver is lost (e.g., due to an obstruction, inclement weather, etc.). In some embodiments, the process may automatically start periodically, e.g., 10 times per second or any other predetermined time period depending, for example, on the processing power of the receiver, required frequency accuracy or frequency drift rate at the receiver.

At 103, the method may determine whether a reset of the receiver is pending. If a reset is pending, Yes at 103, the system may proceed to 110.

If a reset is not pending, No at 103, the system may proceed to 120.

At 110, the method may begin an AFC connection method as described more fully below (see, e.g., FIG. 2 and the corresponding discussion).

At 120, the method may determine whether a common bulk frequency offset exists and at least one demodulator is locked. For example, a demodulator is locked if it is locked on/synchronized with the carrier signal frequency. A correct frequency offset value enables the demodulator to be locked onto the carrier signal frequency. If at least one demodulator is locked, Yes at 120, the method may proceed to 130.

The bulk frequency offset may correspond to a coarse frequency correction that enables the locked demodulator to reduce a current frequency offset present between the reference signals (e.g., satellite and terrestrial reference signals) and a signal of interest (e.g. the signal to be processed from what data may be extracted) being received at the receiver. A demodulator locks after a known pattern embedded in the receiver signal is detected.

If bulk frequency offset correction is implemented and the demodulator is locked, Yes, at 120, the process proceeds to 130. If bulk frequency offset correction is not implemented and/or none of the system demodulators are locked, No, at 120, the method may proceed to 125.

At 125, a watchdog timer (WDT) may time out because all the system demodulators may be unlocked for a specified duration of time. When this occurs, the method may proceed to 125 and reinitialize the AFC system. At 130, the method may reset the WDT since at least one demodulator is locked.

At 140, the AFC method may measure and store a frequency offset (e.g., "DemodOffset[i]") for each of the locked demodulators.

At 150, one of the locked demodulators may be designated as a reference demodulator and used as a frequency offset tracking reference for any of the remaining unlocked demodulator(s). In some embodiments, frequency offset values for each of the locked demodulators may be measured and stored in the memory of the AFC system.

Frequency offsets associated with the reference signal and the reference demodulator may then be used for implementing frequency offset corrections of unlocked signals at an unlocked demodulator.

For example, as soon as at least one of the demodulators is observed to be locked, a coarse frequency correction may be performed for an unlocked demodulator and an absolute frequency offset for each locked signal may be measured and stored in the memory of the AFC system.

The absolute frequency offset value may be based on calculating a difference between the locked demodulator's second order term (once locked to a signal) and a nominal default value (which assumes no offset).

Selection of the reference demodulator may be performed based on identifying a first demodulator that is found to be locked. For example, a predefined order (e.g., T1A, T1B, CA, CB, TERR, T2A, T2B, SAT2, and SAT1) may be used for scanning through all the demodulators to identify a first locked demodulator and designate this demodulator as the reference demodulator. In another embodiment, the system may search for the reference demodulator by checking all the locked demodulators in a predefined order. In some embodiments, a predetermined ordering of incoming signals and/or corresponding demodulators may be provided such that a most preferred and available signal and corresponding demodulator may be selected as the reference signal and the reference demodulator.

The reference signal may be identified based on an expected signal integrity and/or desired signal-to-noise ratio. For example, signals from the terrestrial repeaters may be preferred over those from satellite signals, certain terrestrial repeaters may be preferred over other terrestrial repeaters and/or certain satellite signals may be preferred over other satellite signals. The expected signal integrity may be determined based on the signal-to-noise ratio, constellation point variations and/or by calculating a difference in a current second order value and subtracting it from a nominal default value if there was no frequency offset.

The difference may be scaled based on a sampling rate to convert the frequency offset into Hertz.

In other embodiments, other combinations of different signals are provided. Priority of reference signal selection and/or demodulator selection may be based on a preferred list of signals and/or demodulators for frequency tracking purposes.

At 160, the system may determine whether coarse frequency correction has been completed for each of the unlocked demodulators. If coarse frequency correction has been implemented, Yes at 160, the system may proceed to 170 for fine frequency or tracking correction as described later in connection with FIGS. 5 and 6. The fine frequency or tracking correction may update individual channel offset values by a fixed amount whenever a sufficiently large drift in the frequency has been detected. For example, a fine frequency drift threshold may be approximately 500 Hz.

If coarse frequency correction has not been implemented, No at 160, the system may proceed to 165 for coarse correction as described later in connection with FIGS. 3 and 4. In some embodiments, as long as at least one of the system demodulators is observed to be locked (120), the system may proceed to 165 and perform a coarse frequency correction (see also, e.g., FIGS. 3 and 4). The coarse frequency correction may store the value of the frequency offsets for each locked channel. Frequency offsets for each of the unlocked channels may be set to the frequency offset of one of the locked channels.

Figure 3:
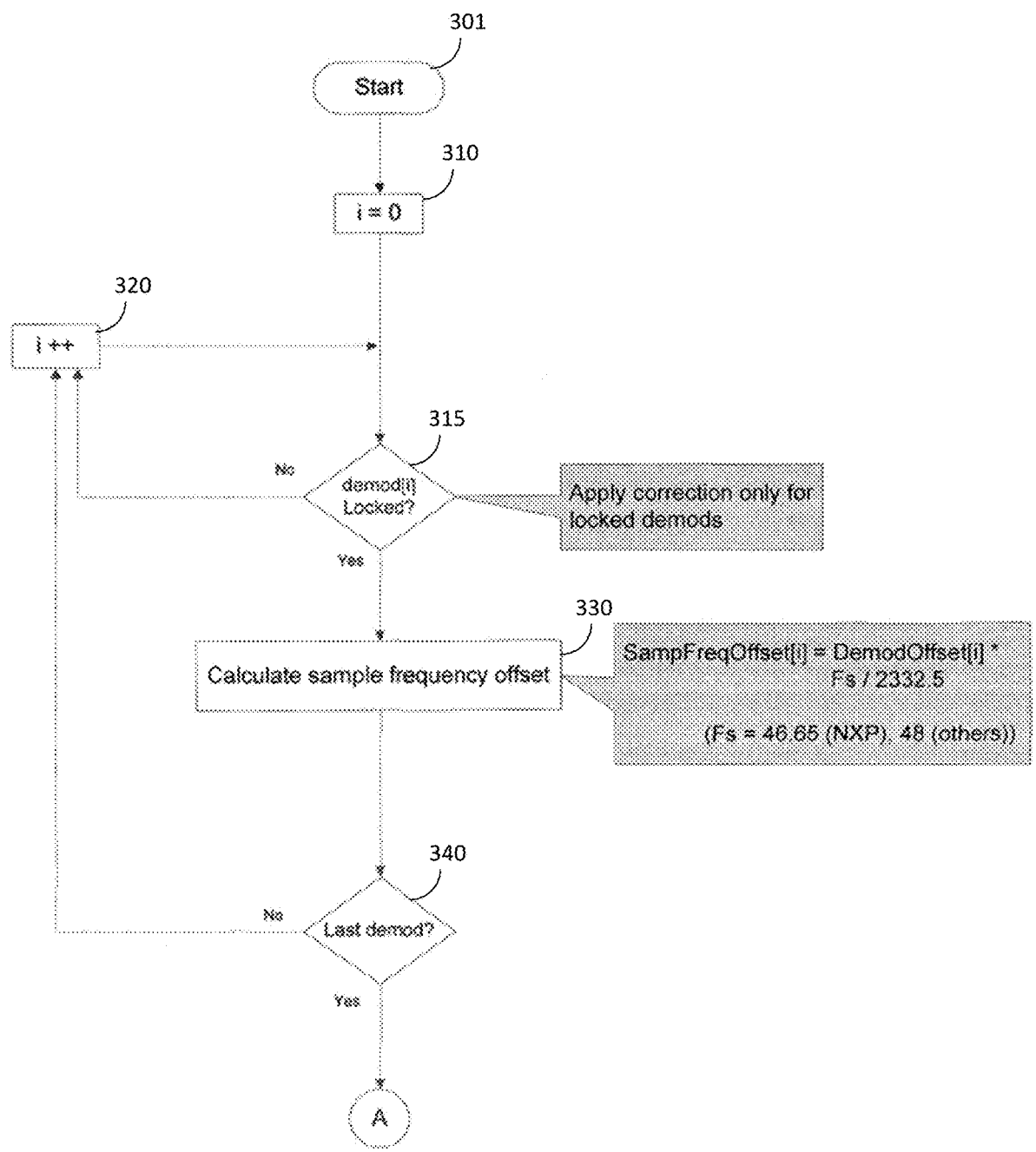
FIGS. 3 and 4 are process flow diagrams of examples of coarse frequency correction in accordance with exemplary embodiments of the present subject matter.
Figure 4:
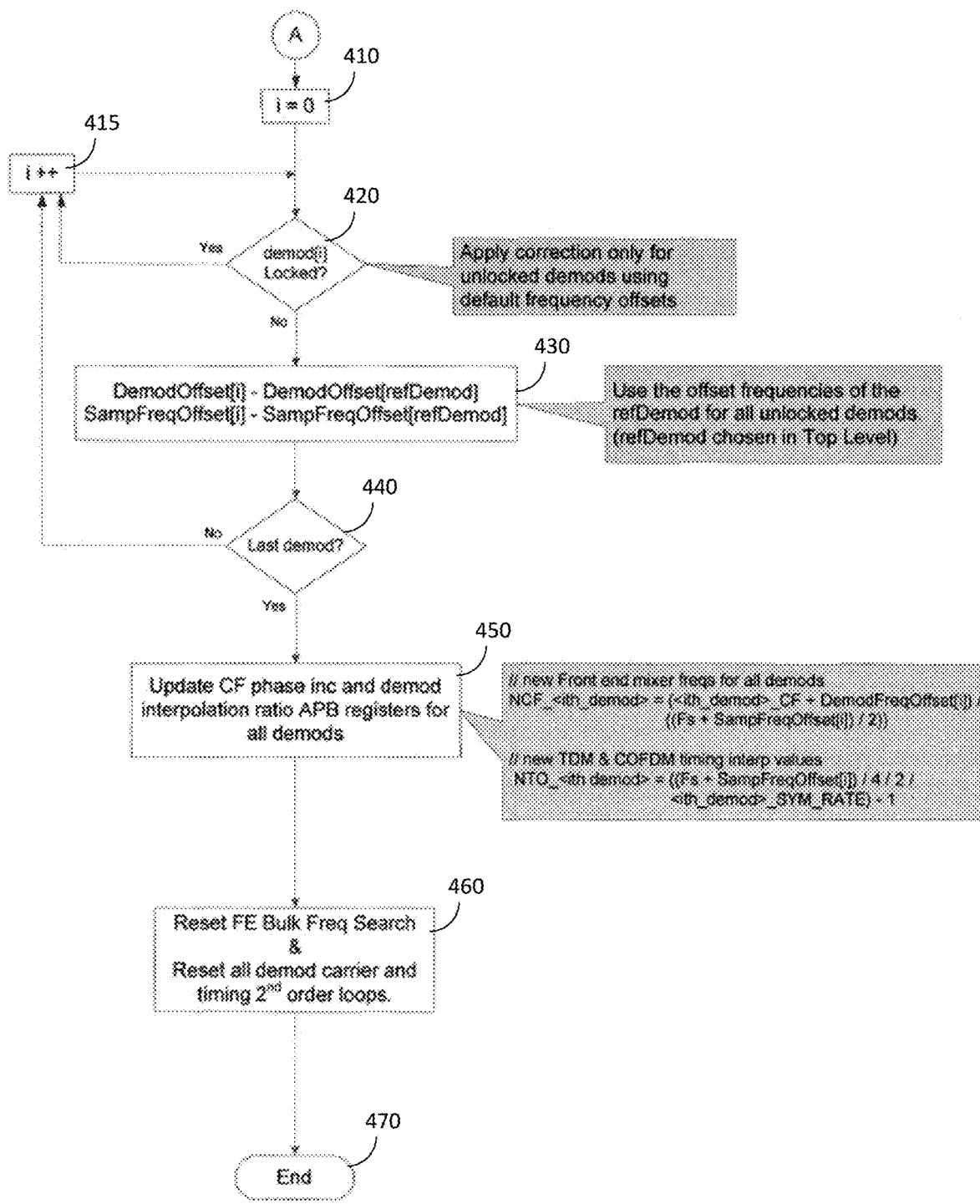

Once coarse frequency correction has been implemented as shown in FIGS. 3 and 4 and 165, the system may set a CoarseDone parameter to equal 1. In some embodiments, once course frequency correction has been completed at 165-166, the system may implement fine frequency tracking or correction as described above. At 180, the coarse frequency and the fine frequency correction process ends.

Figure 2:
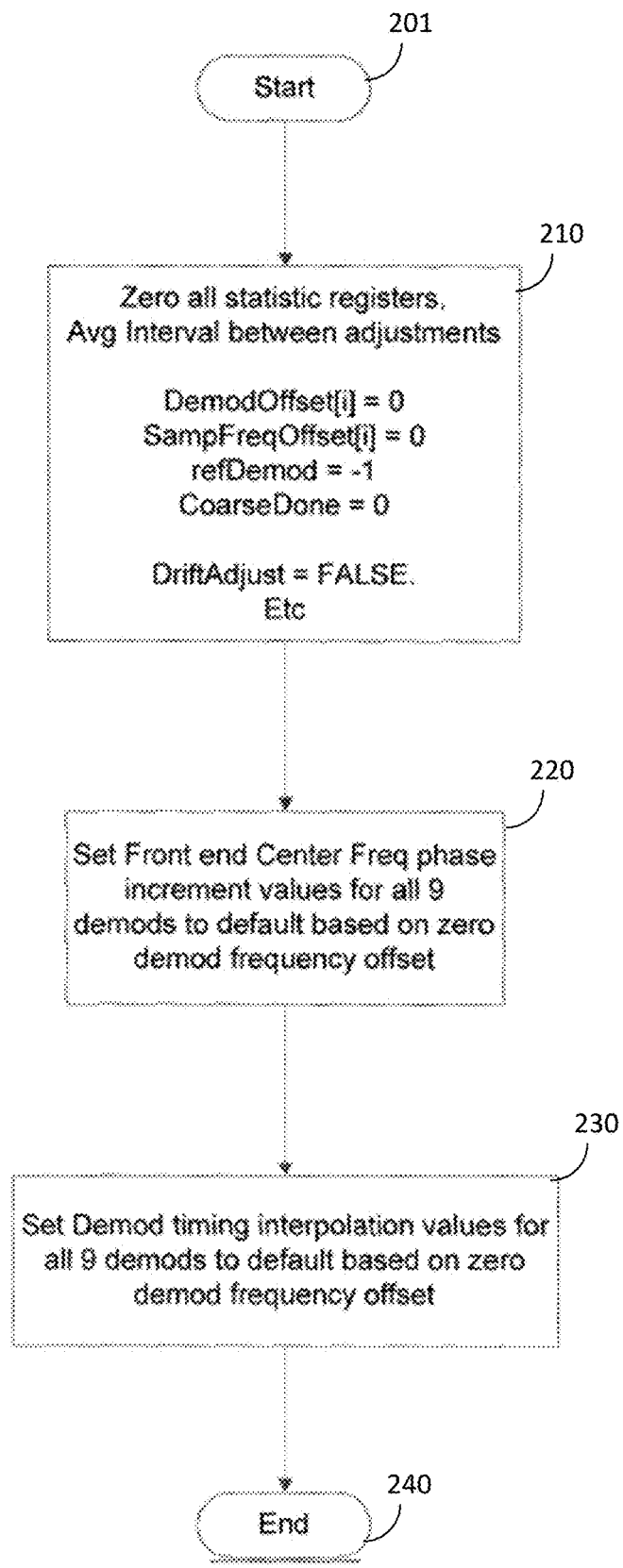
FIG. 2 is an example of a process flow in accordance with an exemplary embodiment of the present subject matter.

FIG. 2 shows an example flowchart 200 for initialization of elements of the demodulators of FIG. 1 in accordance with the present subject matter. In this example, if a system reset occurs (110), all registers may be reset at 210. For example, values of registers DemodOffset[i] and/or SampFreqOffset[i] may be set to 0, wherein i is an integer number (e.g., 1 to n) and n is a total number of the demodulators (e.g., n=9). The register for coarse frequency correction may be reset to 0 indicative of no coarse frequency correction having been applied to the demodulator frequencies. The register for refDemod may be set to −1. Demodulator correction values including those associated with front end center frequency phase increments, may be set to nominal values based on demodulation frequency offsets being reset to 0 (220). Demodulation timing interpolation values may be set to default values based on the demodulator frequency offsets being reset to 0 (230). The system may implement coarse frequency correction once one or more of the n demodulators enter the locked state.

FIGS. 3 and 4 show examples of the coarse frequency adjustment process in accordance with the present subject matter (for example as found at 165 in FIG. 1). Here, the process includes two loops: one for the coarse frequency adjustment of locked demodulators (FIG. 3) and the other for the coarse frequency adjustment of unlocked demodulators (FIG. 4). Initial large frequency offsets for each demodulator may be corrected by changing the registers that control their respective center frequencies.

The process 300 of FIG. 3 is associated with implementing coarse frequency correction for locked demodulators (such as a demodulator) that have respectively locked onto an incoming signal frequency). At 310, a counter ("i") associated with the total number of demodulators is initialized to be zero. At 315, the system determines whether a demodulator corresponding to a current counter value is locked. If a current demodulator (e.g., demod[i], wherein i=0 to the total number of demodulators) is not locked, at 315, the system increments the counter at 320 and proceeds to analyzing the next demodulator. This process may repeat until the system identifies a locked demodulator, Yes at 315, and then proceeds to 330. For each locked demodulator, sample frequency offset values may be measured and stored in a register at 330. The sample frequency offsets may be proportional to a demodulator offset and may be represented, for example, by the formula SampFreqOffset[i]=DemodOffset[i]*Fs/2332.5). Fs may refer to the sampling frequency of the tuner which may vary between approximately 45 MHz and 50 MHz. NXP may refer to a particular tuner designed for the SiriusXm Gen8 receiver, which may have a sampling frequency of approximately 46.65 MHz. Most other SiriusXM receiver tuners may use a sampling frequency of approximately 48 MHz.

Additional frequency correction values may be stored as reference correction values and may be used in the second coarse correction loop of FIG. 4 if an update interval is triggered by the interrupt signal. This measurement at 330 is represented for each of the identified locked demodulators. At 340, the system determines whether the measurement of a currently locked demodulator is the last demodulator to be analyzed in the system. If the current demodulator is not the last locked demodulator, No at 340, the system increments the demodulator counter at 320 and repeats the processes 315, 330 and 340. If the current demodulator is determined to be the last demodulator, Yes at 340, the system proceeds to reset the demodulator counter to zero at 410 and implements coarse frequency correction for unlocked demodulators.

The process flow 400 may comprise a second pass through the demodulators of process flow 300 to make adjustments to the same registers that control the center frequency of unlocked signals. The second pass through applies frequency offset corrections to the unlocked demodulators. At 420, the system determines whether a current demodulator (e.g., demod[i], wherein i=1 to n, where n is the total of demodulators in FIGS. 3 and 4) is locked. For example, the system may determine whether the current demodulator (e.g., demod[1]) has respectively locked onto an incoming signal frequency. If the current demodulator is locked, Yes at 420, the system increments the counter and moves onto the next demodulator (e.g., demod[2]). If the current demodulator (e.g., [demod[2]) is not locked, No at 420, the system proceeds to 430.

At 430, coarse frequency correction is implemented for the unlocked demodulator based on using frequency offset values with respect to the reference signal of the reference demodulator. The reference demodulator is selected as described previously with respect to FIG. 1 at 150.

At 440, the system determines whether a current demodulator is the last demodulator to be analyzed in the system. If the current demodulator is not the last demodulator, No at 440, the system increments the counter at 415 and repeats the processes 420, 430 and 440. If the current demodulator is determined to be the last demodulator, Yes at 440, the system proceeds to 450. At 450, the system may apply the correction values for each of the demodulators that have been stored in system memory to the individual demodulators. Application of the correction values for frequency adjustment may suggest that there is a timing discrepancy in the system, which may affect both frequency and symbol timing of the received signal. The center frequency (NCF) and timing (NTO) coefficients may be calculated and applied to each demodulator. For example, a center frequency (CF) phase increment and/or interpolation ratio (IR) for the respective demodulator may be updated.

The CF phase increment refers to an independent programmable value that the receiver may use to 'center' the signals arriving at fixed and expect offset values at baseband or 0 Hz. If the algorithm determines that a frequency adjustment is needed, the values stored in the registers for the CF phase increment may be updated to the true 'center' frequency.

The interpolation ratio is the ratio of the fixed symbol rate of the signal (e.g. 1.64 MSym/sec for SiriusXM HB Satellite) and the sampling rate Fs of the system. If the algorithm detects a frequency offset, then the system has an offset to the true Fs, which is then determined and used to calculate new values. The second order carrier and timing loops are the heavily averaged values of the current timing and frequency offsets of the received signal. These values are zeroed out after an adjustment to avoid any lag in receiver acquisition or false triggering of the algorithm.

At 460, the demodulators may be reset. For example, after coarse frequency correction has been implemented, carrier and timing coefficients including CF phase increment and IR, for the corresponding demodulators may be reset. Front end bulk frequency search results may also be reset.

Figure 5:
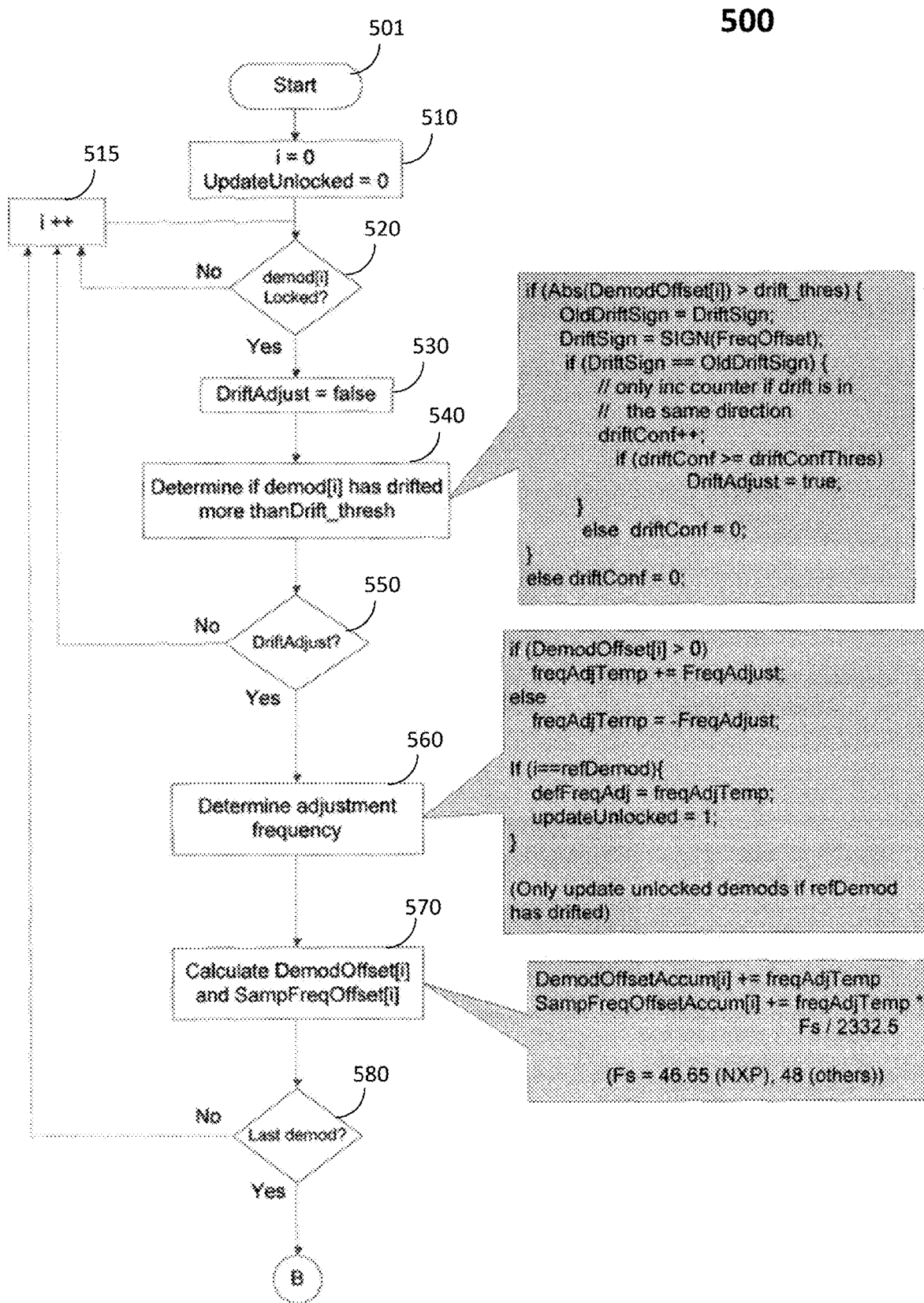
FIGS. 5 and 6 are process flow diagrams of examples of tracking correction in accordance with exemplary embodiments of the present subject matter.
Figure 6:
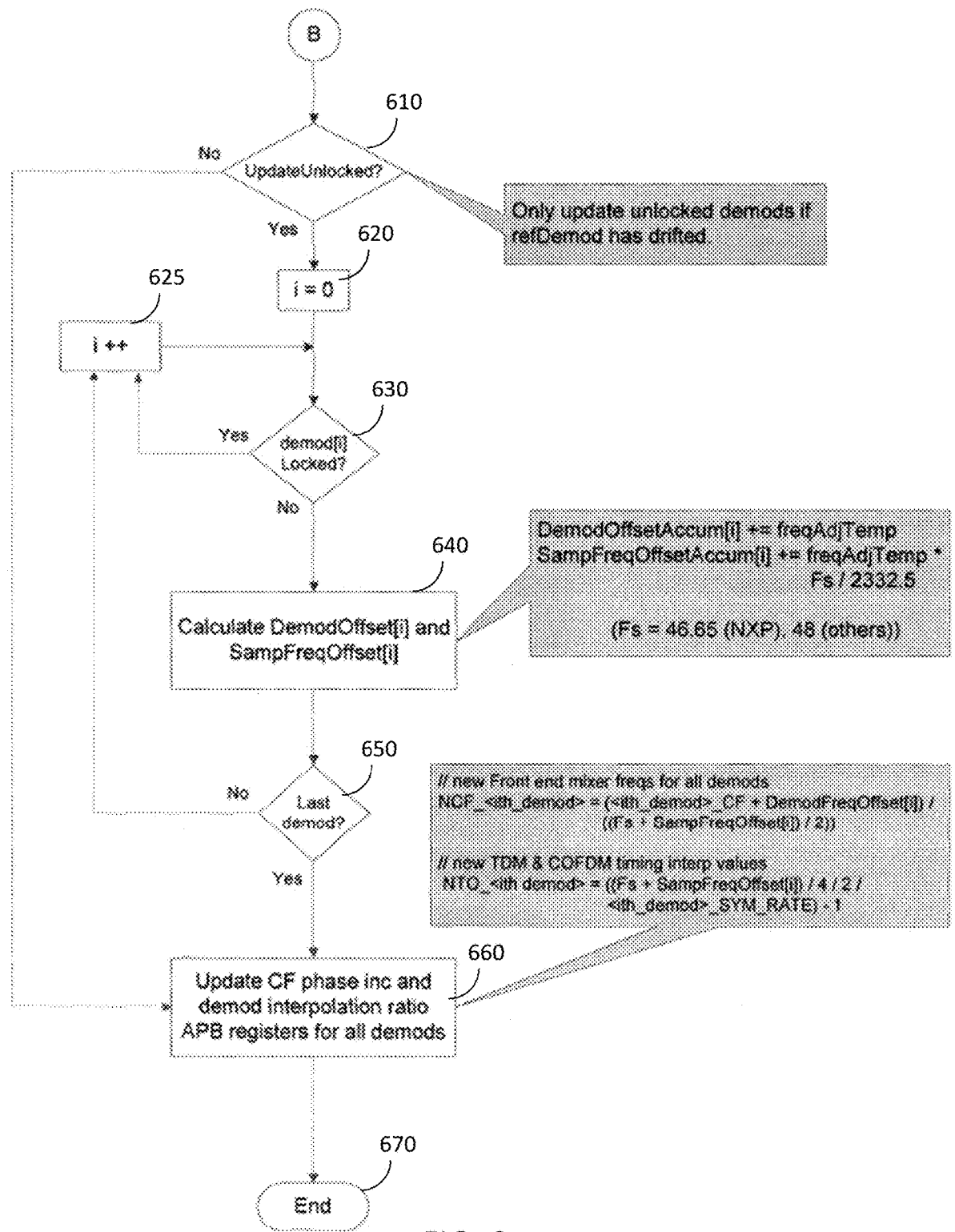

After implementing the coarse frequency corrections with respect to flows 300 and 400, the system may perform frequency tracking correction, for example, as shown in FIGS. 5 and 6. A similar two pass approach, as implemented in FIGS. 3 and 4, for locked and unlocked demodulators may be implemented for making the frequency tracking corrections (e.g., frequency drift adjustments). These adjustments may include fine steps to sense each signal and may be based on a continuous, dynamic process that tracks crystal oscillator frequency drift. During this part of the process, frequency drift adjustments may be made to the locked demodulators, and then to the unlocked demodulators. Similar to FIGS. 3 and 4, the present subject matter may also provide one approach for the locked demodulators (FIG. 5) and a separate approach for the unlocked demodulators (FIG. 6), so that both locked and unlocked demodulators may be locked-in with frequency offsets arising from crystal frequency drifts.

If the measured frequency offset is greater than a predetermined amount, an adjustment may be made to the value stored in that particular channel's frequency correction register. This process may continue until all locked channels have been processed. The present subject matter may provide for a measure of confidence in determining a need for a frequency correction. If the frequency correction is found to be in the same direction for a predetermined number of times, the correction may be deemed necessary and performed. Otherwise, the frequency correction may be skipped and a confidence counter may be reset.

FIG. 5 shows an example process flow for frequency tracking correction applied to locked demodulators. At 501, the system initializes such tracking by initializing a counter (e.g. i=0 to n, where n is the total number of demodulators) and initializing an "UpdateUnlocked" parameter to a value of zero representing no demod has been found to be locked yet so there is no reference to make any adjustments. The system then proceeds to 520 to determine whether a current demodulator is locked onto an incoming signal frequency. If the current demodulator is not locked onto the signal frequency, No at 520, the system increments the demodulator counter and moves to analyzing the next demodulator. If the current demodulator is locked onto the signal frequency, Yes at 520, the system proceeds to 530, wherein a "driftadjust" parameter is initially set to False and moves to steps 540 and 550. Setting the "driftadjust" parameter to False clears the drift adjust request register. The "driftadjust" parameter is set to False because if the current demodulator is locked onto the signal frequency, there is relatively no frequency drift and therefore, no drift adjustment may be needed.

At 540 and 550, the system determines whether the current locked demodulator has drifted more than a predetermined frequency drift threshold (e.g., approximately 500 Hz). If the demodulator has drifted more than the frequency drift threshold, Yes at 550, drift adjustments may need to be made (550) and an amount of frequency adjustment may be determined at 560. If the locked demodulator has not drifted more than the frequency drift threshold, No at 550, drift adjustments may not be needed.

At 570, the system may calculate and implement drift offset values and/or sample frequency offset values corresponding to the current locked demodulator and make corresponding adjustments. At 580, the system determines whether a current demodulator is the last demodulator to be analyzed. If the current demodulator is not the last demodulator, No at 580, the system increments the counter at 515 and repeats the process steps 520, 530, 540, 550, 560, and 570. If the current demodulator is determined to be the last demodulator, Yes at 580, the system proceeds to 610 of flow 600 shown in FIG. 6.

FIG. 6 shows an example process flow for frequency tracking correction applied to unlocked demodulators. At 610, the system determines whether it is necessary to update a number of unlocked demodulators by adjusting a corresponding oscillator frequency of the demodulator. It may be necessary to update the number of unlocked demodulators if the reference demodulator has drifted, Yes at 610. For example, if a center frequency of the reference demodulator has drifted, the system may need to re-check which demodulators are still locked onto the reference signal and which demodulators are now unlocked and proceed to 620. If the system determines that the center frequency of the reference demodulator has not drifted, No at 610, the system proceeds to 660 described later.

At 620, the system initializes a demodulator counter to zero. The system then proceeds to 630 to determine whether a current demodulator is locked onto an incoming reference signal frequency. If the current demodulator is locked onto the signal frequency, Yes at 630, the system increments the counter and moves onto analyzing the next demodulator. If the current demodulator is not locked onto the signal frequency, No at 630, the system proceeds to 640 and calculates an offset frequency value and/or a sample frequency offset corresponding to the current demodulator. At 650, the system determines whether a current demodulator is the last demodulator to be analyzed. If the current demodulator is not the last demodulator, No at 650, the system increments the counter at 625 and repeats the process s 630, 640, and 650. If the current demodulator is determined to be the last demodulator, Yes at 650, the system proceeds to 660. At 660, the system updates center frequency phase and/or demodulator interpolation ratio for the corresponding demodulator.

If the reference demodulator required a drift correction, the correction registers of all of the unlocked channels may be adjusted by the same amount as was the reference channel. It is important to note that these adjustments may be made if a correction of the reference demodulator is required. Once the last channel is processed, the center frequency (NCF) and timing (NTO) coefficients may be calculated and applied to each demodulator.

In some embodiments, the receiver may be configured to perform the present AFC method ten times each second. In some embodiments, the receiver may be configured to perform the AFC method at other periodic intervals. In some embodiments, the receiver may be configured to perform the AFC method via a software update.

As may be appreciated by one skilled in the art, rather than constantly tracking the frequency offset of a reference signal, and using that value to correct the frequency offset at the tuner (by making fine frequency corrections), the present subject matter eliminates the inefficient and expensive hardware implementation required to make such fine frequency corrections. Instead, in some embodiments of the present subject matter, only a coarse frequency correction is needed at the demodulators, while the frequency offsets of each of the channels are separately measured, stored, and corrected. In some embodiments, these fine frequency adjustments may be performed digitally in baseband processing by one or more processors.

In some embodiments, when one signal is not present, the present subject matter may use accumulated frequency offsets of the other signals for correcting for the missing signal when it reappears. This may be an efficient way to correct for frequency offset related errors resulting from temperature swings of the oscillator (crystal) because that offset should be relatively constant across all the signals. Once a baseline offset is established for a signal, that offset can be continually updated during signal absence by the change in offset with respect to the other signals present. Therefore, when the signal returns, the algorithm will not introduce any errors due to drift in frequency during the signal absence. Other approaches, may choose to select a single signal for tracking and jumping to another signal when absent. However, any offsets between the signals will create a constant push/pull tug of war in the system as signals come and go. If the offsets are too large (multiple kHz), then the demodulators may lose lock during the exchange, leading to potential performance degradation of the system. The downside is that any offsets between the signals may be treated digitally, as there is only one correction made at the tuner. Small offsets (multiple kHz), such as expected for the current implementation, are inconsequential. However, larger offsets would eventually affect system performance in particular signals, due to filter bandwidths and other interference. The current implementation does not require any preference in signal selection. In some embodiments, the selection may based on an arbitrary order determined by the coding of the implementation. However, overall system performance and signal availability could be used to prioritize the order, by noting which signal may be most sensitive to frequency offsets.

Figure 7:
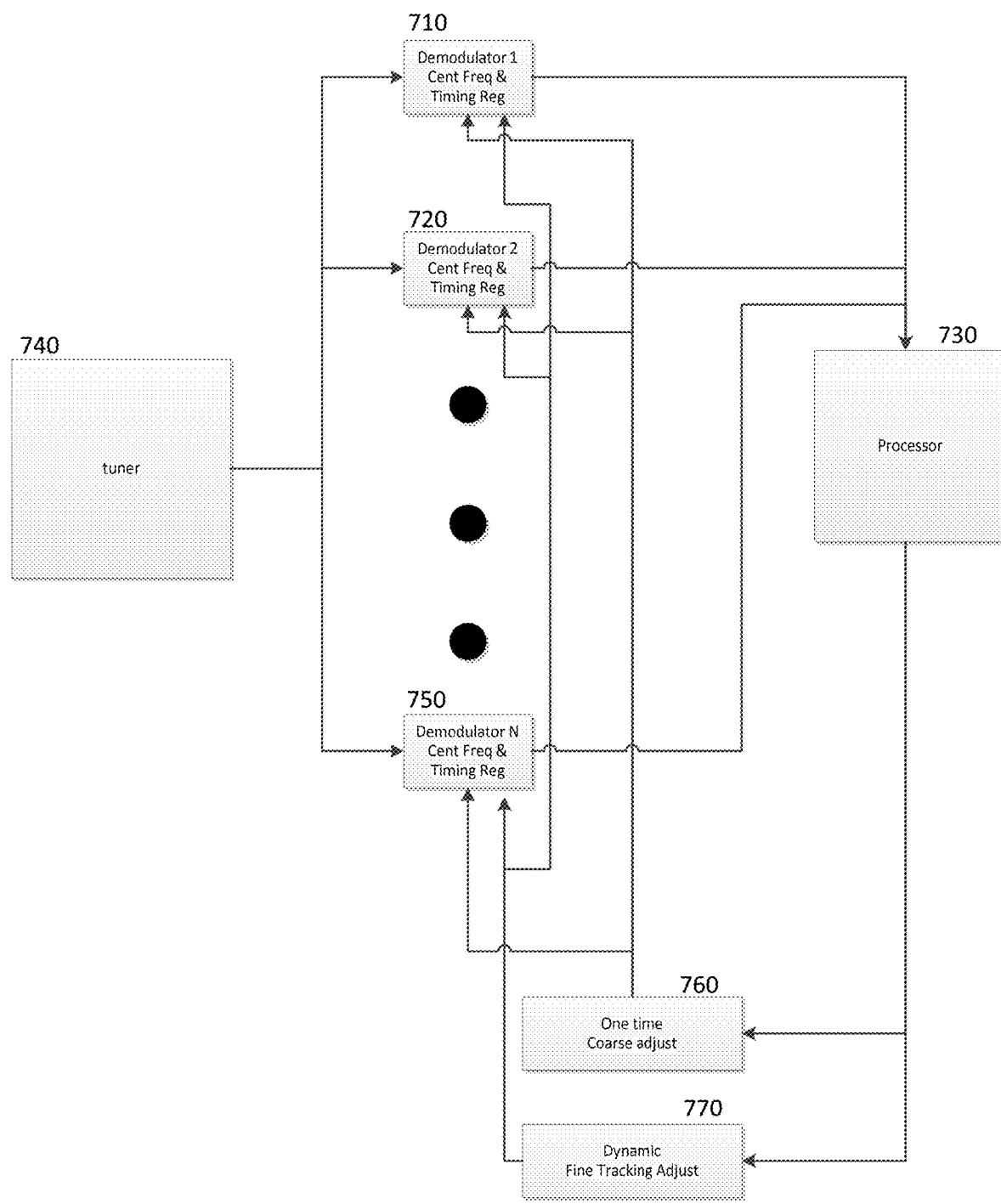
FIG. 7 is an example of a system diagram for the Sirius XM broadcast network.

FIG. 7 shows an example block diagram comprising basic components of a receiver implementing this invention, including, for example, a tuner 740, a plurality of demodulators 710, 720, . . . 750 coupled to the tuner, a processor 730 implementing the AFC, a coarse frequency adjustment module 760, and a dynamic fine tracking module 770 for making adjustments to the measured frequency offsets. The coarse frequency adjustment module 760 may implement the process flows 100, 200, 300 and 400 as described earlier with respect to FIGS. 1, 2, 3 and 4. The dynamic fine tracking module 770 may implement process flows 500 and/or 600 as described earlier with respect to FIGS. 5 and 6 and may be capable of fine frequency adjustments. Each demodulator may include corresponding center frequency and timing registers.

As may be appreciated by one skilled in the art, the present subject matter allows for the use of many different tuner types and eliminates the need for external tuner center frequency adjustment. This provides a cost-effective way for multi-channel receivers to implement accurate and automatic frequency control. It may uniquely compensate for inter-channel frequency offsets by tracking the frequency drift for all channels, including those for which signals are not present. The present subject matter may solve the problem of audio muting caused by COFDM frequency bin selection error when the signals of individual channels appear and disappear while the tuner center frequency is drifting.

Although the exemplary implementation discussed above involves a system with nine demodulators, the present subject matter may be implemented in any system that has two or more demodulators.

The invention claimed is:

1. A data receiver, comprising:
    a tuner, wherein the tuner receives a plurality of modulated signals; and
    at least one processor, wherein the processor designates one of the plurality of modulated signals as a reference signal;
    wherein the at least one processor further detects a first demodulator that is locked onto a first signal of the plurality of modulated signals;
    wherein the at least one processor further determines that a frequency drift of the first demodulator satisfies a predetermined threshold drifts; and
    on a condition that the frequency drift satisfies the predetermined threshold shift, the at least one processor further calculates a frequency offset associated with the reference signal and the first demodulator adjusts the first modulated signal, based on the frequency offset, to generate a first demodulated signal.

2. The data receiver of claim 1, wherein the at least one processor further calculates a sample frequency offset based on the frequency offset.

3. The data receiver of claim 1, wherein the designating the one of the plurality of modulated signals as a reference signal is based on the signal satisfying an expected signal integrity.

4. The data receiver of claim 3, wherein the satisfying the expected signal integrity is based on determining at least one of: an expected signal-to-noise ratio, constellation point variations, and calculating a difference between a second order value and a nominal default value.

5. The data receiver of claim 1, wherein the at least one processor further determines that the reference signal is associated with a frequency drift, detects a second demodulator that is unlocked, and adjusts a demodulator offset value and a sample frequency offset value associated with the second demodulator based on the frequency drift of the reference signal.

6. The data receiver of claim 5, wherein the at least one processor further adjusts frequency offset values for a remaining number of unlocked demodulators based on the frequency drift.

7. The data receiver of claim 6, wherein interpolation rations and center frequency phase increments are updated, respectively, corresponding to the unlocked demodulators.

8. A data receiver comprising:
    a tuner for receiving, over a satellite broadcast, a plurality of signals, wherein the plurality of signals are respectively demodulated by a plurality of demodulators; and
    at least one processor for designating one of the plurality of demodulators as a reference demodulator based on a predefined order;
    wherein the at least one processor further determines that a first demodulator of the plurality of demodulators is unable to lock to a corresponding first signal of the plurality of signals; and
    wherein the at least one processor further applies a reference frequency offset associated with the reference demodulator to the first demodulator, wherein the reference frequency offset is based on a frequency offset between a reference signal being received by the reference demodulator and an oscillator.

9. The data receiver of claim 8, wherein the reference signal is one of the plurality of signals, and wherein the designating the one of the plurality of demodulators as the reference demodulator is further based on determining that the demodulator is locked onto the reference signal.

10. The data receiver of claim 9, wherein the at least one processor further identifies a second demodulator of the plurality of demodulators that is locked onto a second signal of the plurality of signals and calculates a sample frequency offset for the second demodulator.

11. The data receiver of claim 10, wherein the at least one processor further stores the sample frequency offset in a memory.

12. The data receiver of claim 10, wherein the at least one process further determines that the reference frequency offset has been applied to a remaining number of unlocked demodulators and updates center frequency phase increments and interpolation ratios respectively associated with the unlocked demodulators.

13. The data receiver of claim 12, wherein register values associated with the unlocked demodulators are reset.

* * * * *